(12) United States Patent
Goden et al.

(10) Patent No.: US 9,991,305 B2
(45) Date of Patent: Jun. 5, 2018

(54) STACKED TYPE SOLID STATE IMAGING APPARATUS AND IMAGING SYSTEM

(71) Applicant: CANON KABUSHIKI KAISHA, Tokyo (JP)

(72) Inventors: Tatsuhito Goden, Machida (JP); Nobuhiko Sato, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 14/807,993

(22) Filed: Jul. 24, 2015

(65) Prior Publication Data
US 2016/0035769 A1  Feb. 4, 2016

(30) Foreign Application Priority Data
Jul. 31, 2014 (JP) .................. 2014-156766

(51) Int. Cl.
*H01L 27/146* (2006.01)
(52) U.S. Cl.
CPC .... *H01L 27/1463* (2013.01); *H01L 27/14667* (2013.01)
(58) Field of Classification Search
CPC .................................. H01L 27/1463
See application file for complete search history.

(56) References Cited

U.S. PATENT DOCUMENTS 7,838,918 B2   11/2010  Naruse et al.
2008/0224136 A1*  9/2008  Wang .................. H01L 27/1463
                                                 257/53
2010/0054418 A1   3/2010  Okada et al.
2012/0286137 A1  11/2012  Yamaguchi
2013/0264485 A1  10/2013  Kawanabe et al.
2013/0341491 A1* 12/2013  Hirose ................ H01L 27/1464
                                                 250/208.1
2014/0035082 A1*  2/2014  Chu .................... H01L 27/1463
                                                 257/432
2014/0159074 A1*  6/2014  Isobe .................. H01L 51/5234
                                                 257/88

FOREIGN PATENT DOCUMENTS

| JP | S57173969 A | 10/1982 |
|----|-------------|---------|
| JP | H05129649 A | 5/1993 |
| JP | H05167056 A | 7/1993 |
| JP | H09275201 A | 10/1997 |
| JP | 2002-334985 | 11/2002 |

(Continued)

OTHER PUBLICATIONS

Japanese Office Action dated Mar. 13, 2018 in Japanese Application No. 2014156766.

*Primary Examiner* — Daniel Whalen
(74) *Attorney, Agent, or Firm* — Fitzpatrick, Cella, Harper & Scinto

(57) ABSTRACT

The present invention reduces the leakage of the electric charge, which occurs at an end of a pixel electrode. An imaging apparatus includes: a plurality of pixel electrodes arranged separately from each other; an insulating film arranged on the pixel electrode; a pixel isolating film of an insulating member arranged between the pixel electrodes; and a photoelectric conversion film arranged on the insulating film, wherein the pixel isolating film contacts the pixel electrode.

20 Claims, 12 Drawing Sheets

(56) References Cited

FOREIGN PATENT DOCUMENTS

| | | |
|---|---|---|
| JP | 2008-256677 A | 10/2008 |
| JP | 2010-056396 | 3/2010 |
| JP | 2012-238648 | 12/2012 |
| JP | 2013-219067 | 10/2013 |
| JP | 2014-127545 A | 7/2014 |
| WO | 2012/004923 | 1/2012 |

\* cited by examiner

STACKED TYPE SOLID STATE IMAGING APPARATUS AND IMAGING SYSTEM

BACKGROUND OF THE INVENTION

Field of the Invention

The present invention relates to an imaging apparatus and an imaging system.

Description of the Related Art

In recent years, a stacked type solid state imaging apparatus has been reported as a solid imaging apparatus which achieves the enhancement of sensitivity. The technology concerning this stacked type solid state imaging apparatus is disclosed in International Publication No. WO 2012/004923. This stacked type solid state imaging apparatus is provided with a plurality of pixel units on a semiconductor substrate. The pixel unit has a photoelectric conversion film which converts an incident light into a signal charge, a transparent electrode which is formed on the photoelectric conversion film, an insulating film which is formed under the photoelectric conversion film, and a pixel electrode which is formed under the insulating film. This stacked type solid state imaging apparatus operates so as to accumulate the electric charge in its inside, which is generated by photoelectric conversion, when a first voltage is applied to the transparent electrode, and completely discharge the electric charge in the photoelectric conversion film to the transparent electrode, when a second voltage higher than the first voltage is applied to the transparent electrode. According to this technology, the photoelectric conversion film has a depleted state in which the electric charge has been completely discharged, and an accumulated state according to the quantity of light, enables correlation dual detection according to these two states, and achieves the enhancement of sensitivity due to the photoelectric conversion film, as well as reducing noise.

However, in the stacked type solid state imaging apparatus in International Publication No. WO 2012/004923, the insulating film arranged on the pixel electrode is thin, and the insulating film is easily formed thinner in the end of the pixel electrode. Because of this, the electric charge tends to leak in the end of the pixel electrode, and it becomes difficult to stably operate as intended.

The present invention is designed with respect to the above described problems, and reduces the leakage of the electric charge, which occurs at the end of the pixel electrode. Thereby, the present invention is directed at providing an imaging apparatus and imaging system which can stably operate.

SUMMARY OF THE INVENTION

According to an aspect of the present invention, an imaging apparatus comprises: a plurality of pixel electrodes arranged separately from each other; an insulating film arranged on the pixel electrode; a pixel isolating film of an insulating member arranged between the pixel electrodes; and a photoelectric conversion film arranged on the insulating film and the pixel isolating film, wherein an end of the pixel isolating film contacts the pixel electrode.

According to a further aspect of the present invention, an imaging apparatus comprises: a plurality of pixel electrodes arranged separately from each other; an insulating film arranged on the pixel electrode, to cover an end of the pixel electrode; a pixel isolating film of an insulating member arranged between the pixel electrodes; and a photoelectric conversion film arranged on the insulating film and the pixel isolating film, wherein an end of the pixel isolating film contacts a portion of the insulating film covering the pixel electrode.

Further features of the present invention will become apparent from the following description of exemplary embodiments with reference to the attached drawings.

DESCRIPTION OF THE EMBODIMENTS

Preferred Embodiments of the Present Invention will now be described in detail in accordance with the accompanying drawings.

First Embodiment

A first embodiment will be described below. In the present embodiment, a stacked type solid state imaging apparatus will be described in detail below with reference to the drawings.

(Structure of Stacked Type Solid State Imaging Apparatus)

Figure 1:
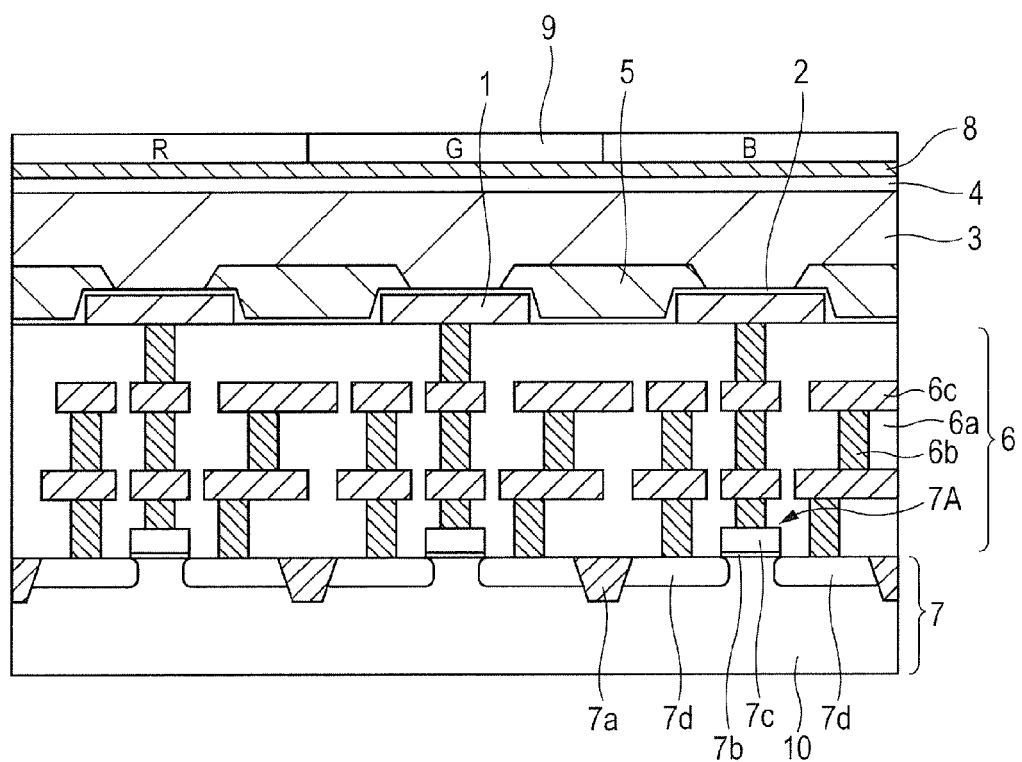
FIG. 1 is a schematic view illustrating a schematic structure of a pixel unit of a stacked type solid state imaging apparatus according to a first embodiment.

FIG. 1 is a schematic sectional view illustrating a structure of a pixel unit of the stacked type solid state imaging apparatus according to the first embodiment.

This solid imaging apparatus is provided with a plurality of pixel units. The pixel unit includes: a plurality of pixel electrodes 1 (three pixel electrodes in illustrated example); an insulating film 2 which is formed on the pixel electrode 1 (Any element or layer of imaging apparatus may be interposed between the pixel electrode 1 and the insulating film 2.); a photoelectric conversion film 3 which is formed on the insulating film 2 and converts incident light into a signal charge; and a transparent electrode 4 which is formed on the photoelectric conversion film 3. A sealing layer 8 is formed on the transparent electrode 4, and color filter layers 9 of R, G and B are arranged on the sealing layer 8. The pixel unit further has a pixel isolating film 5 of an insulating member provided between the adjacent pixel electrodes 1. The insulating film 2 is arranged between the pixel isolation film 5 and the pixel electrode 1. In addition, a wiring layer 6 exists under the pixel electrode 1, and a semiconductor layer 7 which has a signal readout circuit formed thereon is provided under the wiring layer 6.

The wiring layer 6 is a layer for electrically connecting the pixel electrode 1 to the signal readout circuit which is a part of the semiconductor layer 7, and is formed so as to have a multi-layer wiring structure. Each of the layers which constitute the multi-layer wiring structure of the wiring layer 6 is configured so as to have a via 6b and a wire 6c which is connected to the via 6b, in the insulating layer 6a. The pixel electrode 1 is electrically connected to a transistor 7A which is formed in the semiconductor layer 7, through the wiring layer 6.

The semiconductor layer 7 has the transistor 7A as a part of the signal readout circuit. The transistor 7A is formed on an element region which is demarcated by an element isolation structure (here, STI structure) 7a which is formed on a semiconductor substrate 10. The transistor 7A is configured so as to have a gate electrode 7c which is formed on the semiconductor substrate 10 through a gate insulating film 7b, and have source/drain regions 7d which are formed in both sides of the gate electrode 7c, respectively, on the semiconductor substrate 10. The gate electrode 7c and the source/drain regions 7d are each connected to the via 6b in the bottom layer of the wiring layer 6.

The insulating film 2 is a film for ensuring electric insulation between the pixel electrode 1 and the photoelectric conversion film 3, and is formed from an insulating material such as $SiO_2$, SiN and SiC so as to have a thickness of approximately 10 nm to approximately 100 nm. The insulating film 2 is formed so as to cover at least the upper surface of the pixel electrode 1, and in the present embodiment, so as to cover the whole surface from the upper surface of the pixel electrode 1 to the side surface thereof, in order to separate the pixel electrode 1 from the photoelectric conversion film 3; and is arranged under the pixel isolating film 5 in a region between the adjacent pixel electrodes 1.

When the insulating film 2 is formed thin so as to cover the whole surface of the pixel electrode 1, the insulating film 2 tends to become thin, particularly, on the end of the pixel electrode 1 (side surface of pixel electrode 1 in FIG. 1), and it is difficult to control the thickness of the insulating film 2 at the end. The pixel isolating film 5 is arranged so that the end thereof contacts the insulating film 2 which covers the end of the pixel electrode 1, or is arranged so that the end thereof contacts the insulating film 2 which covers the end of the pixel electrode 1, and also on the upper surface of the pixel electrode 1 through the insulating film 2. Here, the pixel isolating film 5 is buried in the region between the adjacent pixel electrodes 1, and is formed so as to cover the surface from the side surface of the pixel electrode 1 up to a part of the upper surface thereof, through the insulating film 2; and the upper surface thereof is planarized. Here, the ends of the pixel electrode 1 and the pixel isolating film 5 are so-called side surfaces. When the pixel electrode 1 and the pixel isolating film 5 have tapered shapes, at least a part of the surface which connects the upper surface to the lower surface is referred to as the end.

In the present embodiment, the pixel isolating film 5 is formed so as to cover the surface from the side surface of the pixel electrode 1 up to a part of the upper surface thereof, thereby even when the insulating film 2 is formed thin on the end of the pixel electrode 1, the pixel isolating film 5 compensates for the thin film, and sufficient electric insulation between the pixel electrode 1 and the photoelectric conversion film 3 is ensured. Thereby, the leakage of the electric charge from the photoelectric conversion film 3 is reduced, which occurs at the end, and the operation is stabilized. In addition, even when it is difficult to control the thickness of the insulating film 2 at the end of the pixel electrode 1, the end is covered with the pixel isolating film 5, and thereby a voltage to be applied to the photoelectric conversion film 3 is stabilized. The pixel isolating film 5 is formed so as to be buried in the region between the adjacent pixel electrodes 1, and thereby crosstalk between the pixels is reduced. The pixel isolating film 5 is formed so as to be thicker than the pixel electrode 1, and thereby the reduction of the crosstalk is more surely achieved. The upper surface of the pixel isolating film 5 is planarized, and thereby the photoelectric conversion film 3 which is arranged on the pixel isolating film 5 can be flatly formed.

Figure 2:
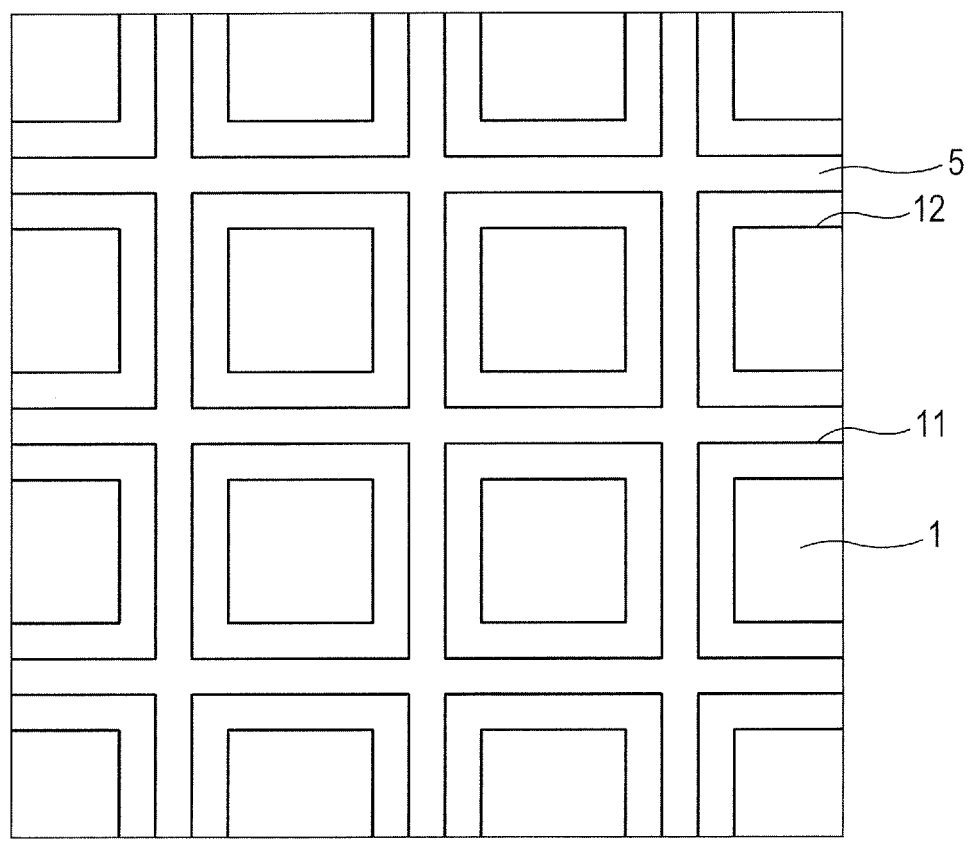
FIG. 2 is a schematic plan view illustrating a relation between a pixel electrode and a pixel isolating film, in the stacked type solid state imaging apparatus according to the first embodiment.

FIG. 2 is a schematic plan view illustrating a relation between the pixel electrode 1 and the pixel isolating film 5.

A plurality of pixel electrodes 1 corresponding to the respective pixels is arranged separately from each other. The pixel isolating film 5 is arranged in the region between the adjacent pixel electrodes 1. An end 11 of the pixel electrode 1 and an end 12 of the pixel isolating film 5 may exist in the same position, but in the present embodiment, the end 12 of the pixel isolating film 5 is arranged on the upper surface of the pixel electrode 1 as in FIG. 1 and FIG. 2, in consideration of an alignment accuracy of both the ends 11 and 12, variation in the manufacture and the like. A width of a portion on which the pixel isolating film 5 overlaps with the pixel electrode 1 is set at approximately 0.1 μm to approximately 0.2 μm. In order to enhance the sensitivity of the solid imaging apparatus, an aperture area of the pixel electrode 1 can be enlarged as much as possible. Because of this, the width of the overlapping portion can be reduced within a range in which the alignment accuracy of both the ends 11 and 12 and the variation in the manufacture are improved.

Amorphous silicon, a compound semiconductor, an organic semiconductor or the like can be used for a material of the photoelectric conversion film 3. As for the compound semiconductor, the following compounds are suitable which include, for instance, III-V compound semiconductors such as BN, GaAs, GaP, AlSb and GaAlAsP, II-VI compound semiconductors such as CdSe, ZnS and HdTe, and IV-VI compound semiconductors such as PbS, PbTe and CuO. As for the organic semiconductor, the following compounds are suitable which include, for instance, fullerene, coumarin 6

(C6), rhodamine 6G (R6G), zinc phthalocyanine (ZnPc), quinacridone, phthalocyanine-based compounds, and naphthalocyanine-based compounds. In addition, as for the photoelectric conversion film 3, a quantum dot film can be used which employs the above described compound semiconductor as a raw material. The quantum dot film of which the interfacial defect is sufficiently compensated is easily fully depleted, and accordingly is suitable. When the above described semiconductor is used, an intrinsic semiconductor having small carrier density can be used so as to sufficiently expand the width of a depletion layer, but an N-type or a P-type semiconductor can also be used.

(Process of Manufacturing Stacked Type Solid State Imaging Apparatus)

A process of manufacturing the stacked type solid state imaging apparatus according to the present embodiment will be described below. FIGS. 3A to 3C and FIGS. 4A to 4C are schematic sectional views illustrating the process of manufacturing the stacked type solid state imaging apparatus according to the first embodiment, in a step order. In FIGS. 3A to 3C and FIGS. 4A to 4C, the same component members as those in FIG. 1 are designated by the same reference numerals.

Figure 3A:
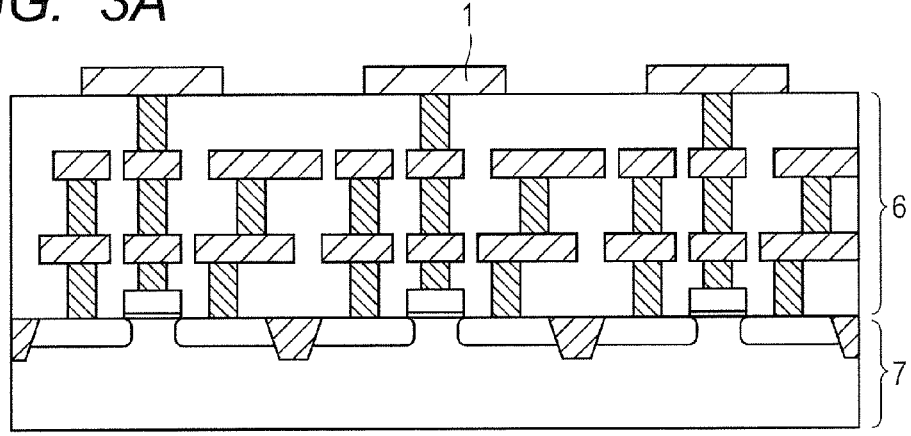
FIGS. 3A, 3B and 3C are schematic sectional views illustrating the process of manufacturing a layer type solid imaging apparatus according to the first embodiment in a step order.

Firstly, as is illustrated in FIG. 3A, the semiconductor layer 7 and the wiring layer 6 are formed on the semiconductor substrate 10 of silicon or the like, and the pixel electrode 1 is formed on the wiring layer 6.

Specifically, firstly, the element isolation structure 7a is formed in the semiconductor substrate 10, for instance, with a STI (Shallow Trench Isolation) method, and the element region is demarcated. The transistor 7A which is a part of the signal readout circuit is formed on the element region. As for a method of forming the transistor 7A, the thin gate insulating film 7b of $SiO_2$ or the like is formed on the element region, and the gate electrode 7c is formed on the gate insulating film 7b. Ions of P-type or N-type impurities are implanted in both sides of the gate electrode 7c in the element region, and the source/drain region 7d is formed.

Next, the wiring layer 6 having the multi-layer wiring structure is formed. As for a method of forming each of the layers which constitutes the multi-layer wiring structure of the wiring layer 6, the insulating layer 6a of $SiO_2$ or the like is formed, and a via hole is formed in the insulating layer 6a. After that, the via hole is buried with a material which is selected from metal such as Al, Cu, W, Ti and TiN, for instance, and the surface thereof is planarized with a chemical mechanical polishing method (Chemical Mechanical Polishing: CMP) or the like. Thus, the via 6b is formed. After that, the wire 6c is formed which is connected to the via 6b. One material selected from Al, Cu, W, Ti, TiN and the like, for instance, is used for the material of the wire 6c. As in the above description, each of the layers is formed so as to be stacked, and the wiring layer 6 is formed. In the wiring layer 6, vias 6b in the bottom layer are connected to the gate electrode 7c and the source/drain regions 7d, respectively.

Next, the pixel electrode 1 which is connected to the via 6b in the top layer is formed on the insulating layer 6a in the top layer in the wiring layer 6. Al, Cu, W, Ti, TiN or the like, for instance, is used for the material of the pixel electrode 1. The pixel electrode 1 is formed so as to have a thickness of approximately 10 nm to approximately 500 nm. When the pixel electrode 1 is formed thick, the resistance can be lowered. Accordingly, the pixel electrode 1 can be used as a signal wire and/or a power source wire of a driving circuit which is arranged in the periphery of a pixel region, and the size can be reduced. When the pixel electrode 1 is formed thin, the step becomes small. Accordingly, the leakage of the electric charge can be reduced, which occurs in the insulating film 2. When the pixel electrode 1 is formed so as to have a thickness of approximately 10 nm to approximately 500 nm, the size can be reduced and also the leakage of the electric charge can be reduced, which occurs in the insulating film 2.

Figure 3B:
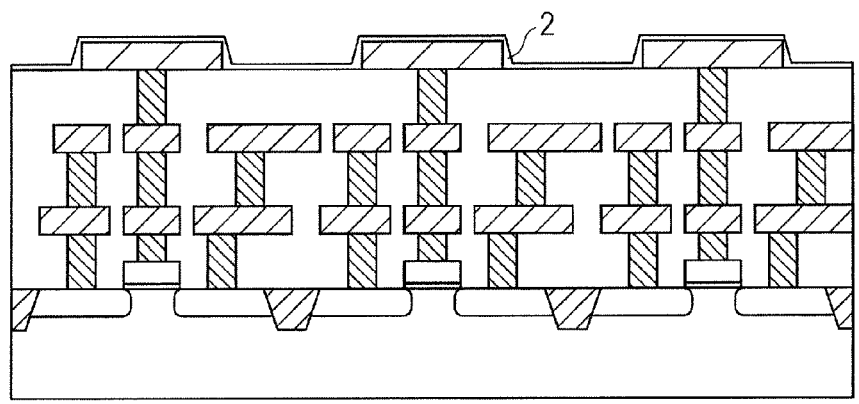

Subsequently, the thin insulating film 2 is formed as is illustrated in FIG. 3B.

Specifically, a material of $SiO_2$, SiN, SiC or the like is deposited so as to have a thickness of approximately 10 nm to approximately 100 nm, with a CVD method, for instance. By the above steps, the thin insulating film 2 is formed on the wiring layer 6 so as to cover the pixel electrode 1. When the insulating film 2 is formed thin, the voltage to be applied to the photoelectric conversion film 3 which will be formed in a post-step can be lowered, and the power consumption is reduced. However, the insulating film 2 can be formed so that the thickness of the extent can be ensured in which electrons or holes cannot pass through the insulating film 2 in spite of the tunnel effect, and so that the thickness becomes larger than a step formed by concave and convex on the surface of the pixel electrode 1, in order to avoid a defect of the formed film.

Figure 3C:
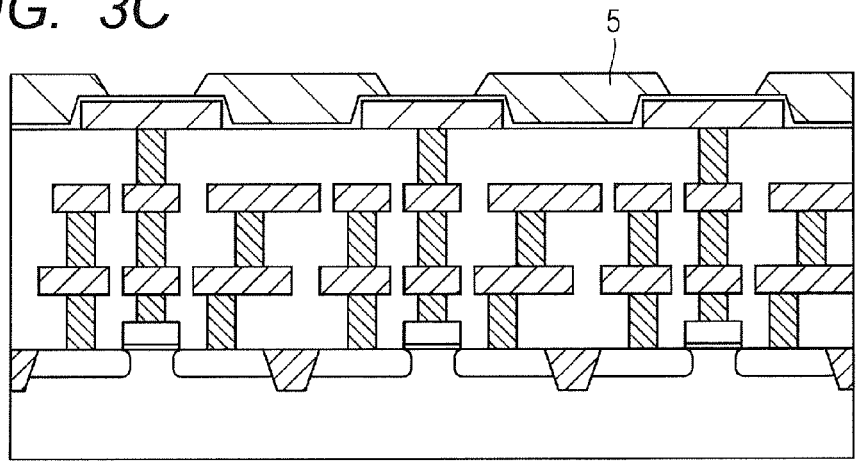

Subsequently, the pixel isolating film 5 is formed as is illustrated in FIG. 3C.

Specifically, an inorganic material such as $SiO_2$, SiN and SiC or an organic material such as acrylic and polyimide is formed on the whole surface on the insulating film 2, and the surface of the material is planarized. After that, a resist mask is formed by lithography, and the material is etched until a part of the surface of the insulating film 2 is exposed, while using this resist mask. Thereby, the pixel isolating film 5 is formed. When the pixel isolating film on the pixel electrode 1 is removed, it is necessary to retain the insulating film 2 on the pixel electrode 1. Because of this, the material of the insulating film 2 and the material of the pixel isolating film 5 can be different from each other. For instance, it is considered to use SiN or SiC for the material of the insulating film 2, and use $SiO_2$, acrylic or polyimide for the material of the pixel isolating film 5.

When the inorganic material is used, the pixel isolating film 5 is desirably formed so as to have a thickness of approximately 200 nm to approximately 500 nm, and when the organic material is used, the pixel isolating film 5 is desirably formed so as to have the thickness of approximately 1 µm to approximately 2 µm. When the pixel isolating film 5 is formed thicker than the insulating film 2, the leakage of the electric charge can be reduced, which occurs in the insulating film 2 at the end of the pixel electrode 1. In addition, when the pixel isolating film 5 is formed thicker than the pixel electrode 1, the region between the pixel electrodes 1 results in being filled with a large insulating structure, which can be effective in the point of reducing the crosstalk.

As for a method of planarizing the upper surface of the pixel isolating film 5, when the inorganic material has been used, the pixel isolating film 5 is formed thicker than predetermined thickness, and then the film is subjected to a planarizing process, for instance, CMP. When the organic material has been used, such a material is used as to show an adequate planarization performance when the organic material has been applied. When the upper surface of the pixel isolating film 5 is flat, the thickness of the pixel isolating film 5 on the pixel electrode 1 becomes a value obtained by subtracting the thickness of the pixel electrode 1 from the thickness of the pixel isolating film 5 in the region between the adjacent pixel electrodes 1.

Figure 5:
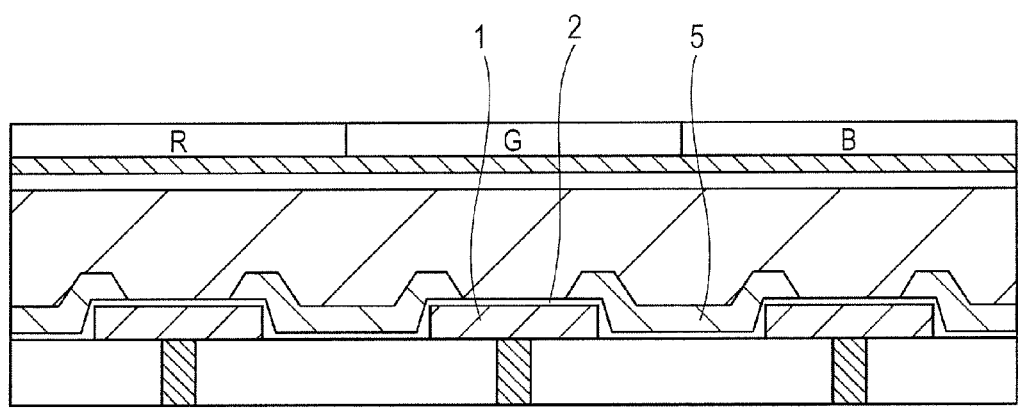
FIG. 5 is a schematic sectional view illustrating a case where the upper surface of the pixel isolating film is not planarized, in the process of manufacturing the layer type solid imaging apparatus according to the first embodiment.

FIG. 5 is a schematic sectional view illustrating a case where the upper surface of the pixel isolating film 5 is not planarized.

The thickness of the pixel isolating film 5 on the pixel electrode 1 and the thickness thereof in the region between the pixel electrodes 1 are approximately equal to each other. In the region between the pixel electrodes 1, the upper surface of the pixel isolating film 5 is recessed by the thickness of the pixel electrode 1, and is formed into a concave shape, but in such a structure as well, the leakage of the electric charge can be avoided, which occurs in the insulating film 2 at the end of the pixel electrode 1.

Figure 4A:
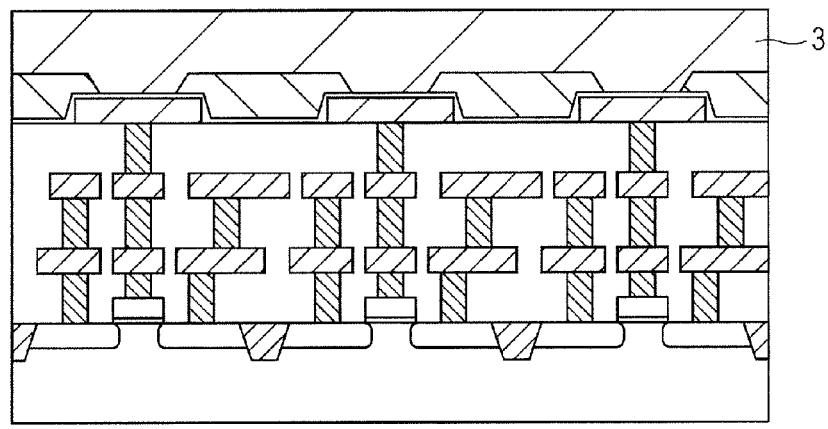
FIGS. 4A, 4B and 4C are schematic sectional views subsequent to FIGS. 3A, 3B and 3C, which illustrates the process of manufacturing the layer type solid imaging apparatus according to the first embodiment in the step order.

Subsequently, the photoelectric conversion film 3 is formed as is illustrated in FIG. 4A.

Specifically, amorphous silicon, the above described compound semiconductor, the above described organic semiconductor or the like is deposited on the whole surface, and the photoelectric conversion film 3 is formed. The photoelectric conversion film 3 is formed on the pixel isolating film 5 and the pixel electrode 1; and on the pixel electrode 1, is formed so as to face each other through the insulating film 2.

Figure 4B:
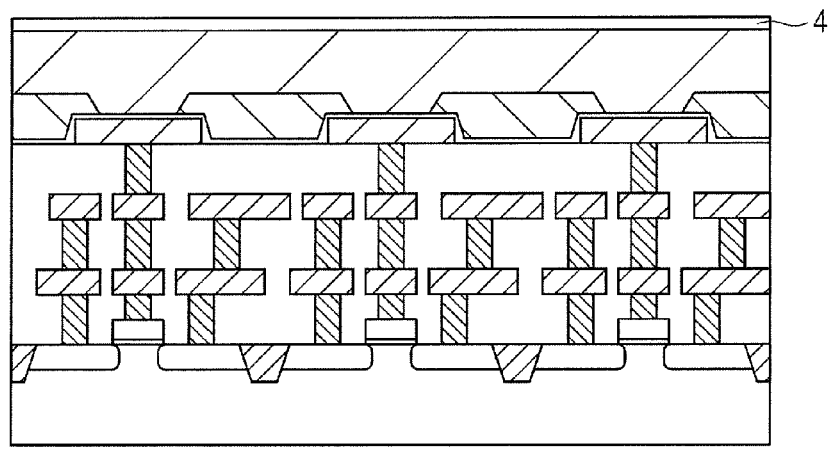

Subsequently, as is illustrated in FIG. 4B, the transparent electrode 4 is formed.

Specifically, ITO, IZO, ZnO or the like is deposited on the photoelectric conversion film 3, and the transparent electrode 4 is formed.

Figure 4C:
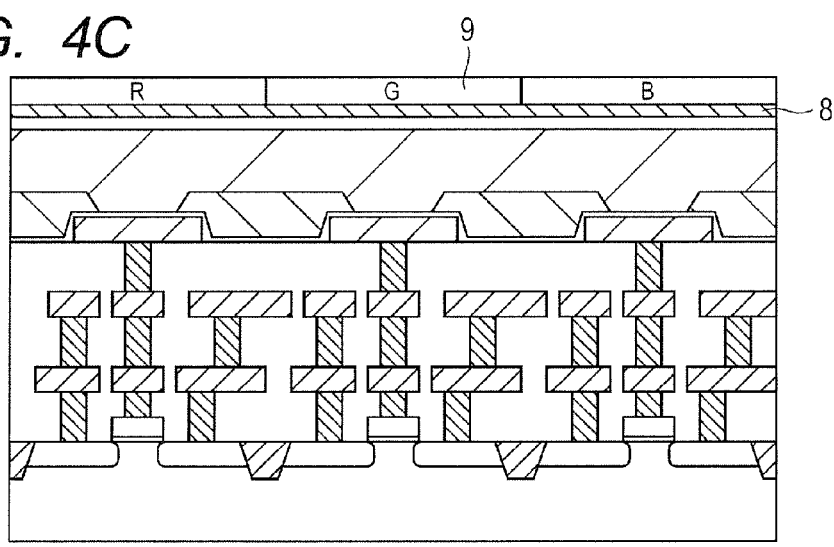

After the above step, as is illustrated in FIG. 4C, the sealing layer 8 and the color filter layer 9 are sequentially formed.

In the above way, the stacked type solid state imaging apparatus according to the present embodiment is formed.

According to the present embodiment, the leakage of the electric charge can be avoided, which occurs at the end of the pixel electrode 1, and the variation in the voltage to be applied to the photoelectric conversion film 3 can be reduced, which occurs at the end of the pixel electrode 1. Thereby, the stacked type solid state imaging apparatus is achieved which has reduced variations in stabilization of operation and in photoelectric conversion characteristics among pixels, and further has reduced crosstalk among the pixels.

Second Embodiment

Next, a second embodiment will be described. In the present embodiment, a stacked type solid state imaging apparatus is disclosed similarly to the first embodiment, but is different from the first embodiment in a point that the structure in the vicinity of the pixel electrode is different.

(Structure of Stacked Type Solid State Imaging Apparatus)

Figure 6:
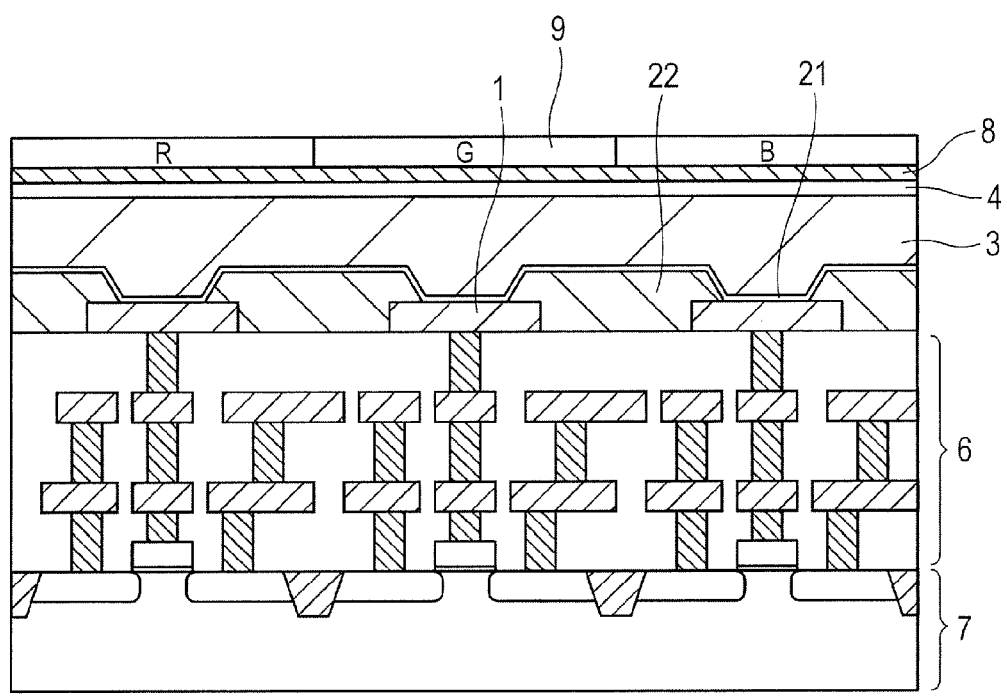
FIG. 6 is a schematic sectional view illustrating a structure of a pixel unit of a stacked type solid state imaging apparatus according to a second embodiment.

FIG. 6 is a schematic sectional view illustrating a structure of a pixel unit of the stacked type solid state imaging apparatus according to the second embodiment. The similar component members to those in the first embodiment are designated by the same reference numerals, and the detailed description will be omitted.

This solid imaging apparatus is provided with a plurality of pixel units. The pixel unit includes: a plurality of pixel electrodes 1 (three pixel electrodes in illustrated example); an insulating film 21 which is formed on the pixel electrode 1; the photoelectric conversion film 3 which is formed on the insulating film 21 and converts incident light into a signal charge; and the transparent electrode 4 which is formed on the photoelectric conversion film 3. The sealing layer 8 is formed on the transparent electrode 4, and the color filter layers 9 of R, G and B are arranged on the sealing layer 8. The pixel unit further has a pixel isolating film 22 of an insulating member provided between the adjacent pixel electrodes 1. In addition, the wiring layer 6 exists under the pixel electrode 1, and the semiconductor layer 7 which has the signal readout circuit formed thereon is provided under the wiring layer 6. Here, the insulating film 2 extends onto the pixel isolating unit 22 from the top of the pixel electrode 1.

The insulating film 21 is a film for ensuring electric insulation between the pixel electrode 1 and the photoelectric conversion film 3, and is formed from an insulating material such as $SiO_2$, SiN and SiC to have a thickness of approximately 10 nm to approximately 100 nm. The insulating film 21 is formed so as to cover the upper surface of the pixel electrode 1 and the pixel isolating film 22.

The pixel isolating film 22 is arranged so that the end thereof contacts the end of the pixel electrode 1 (side surface of pixel electrode 1 in FIG. 6), or the end thereof is arranged on the upper surface of the pixel electrode 1. Here, the pixel isolating film 22 is buried in the region between the adjacent pixel electrodes 1, and is formed so as to cover the surface from the side surface of the pixel electrode 1 up to a part of the upper surface thereof; and the upper surface thereof is planarized.

In the present embodiment, on the upper surface of the pixel electrode 1, the insulating film 21 is arranged, and in the vicinity of the end of the pixel electrode 1, the pixel isolating film 22 is arranged together with the insulating film 21. The end of the pixel electrode 1 is covered with the thick pixel isolating film 22, and sufficient electric insulation is ensured between the pixel electrode 1 and the photoelectric conversion film 3. Thereby, the leakage of the electric charge from the photoelectric conversion film 3 is reduced, which occurs at the end, and the operation is stabilized. In addition, the end is covered with the pixel isolating film 22, and thereby a voltage to be applied to the photoelectric conversion film 3 is stabilized. The pixel isolating film 22 is formed so as to be buried in the region between the adjacent pixel electrodes 1, and thereby crosstalk between the pixels is reduced. The pixel isolating film 22 is formed thicker than the pixel electrode 1, and thereby the crosstalk is more surely reduced. The upper surface of the pixel isolating film 22 is planarized, and thereby the photoelectric conversion film 3 which is arranged on the pixel isolating film 22 can be flatly formed.

(Process of Manufacturing Stacked Type Solid State Imaging Apparatus)

A process of manufacturing the stacked type solid state imaging apparatus according to the present embodiment will be described below. FIGS. 7A to 8C are schematic sectional views illustrating the process of manufacturing the stacked type solid state imaging apparatus according to the second embodiment, in a step order. In FIGS. 7A to 8C, the same component members as those in FIG. 6 are designated by the same reference numerals.

Figure 7A:
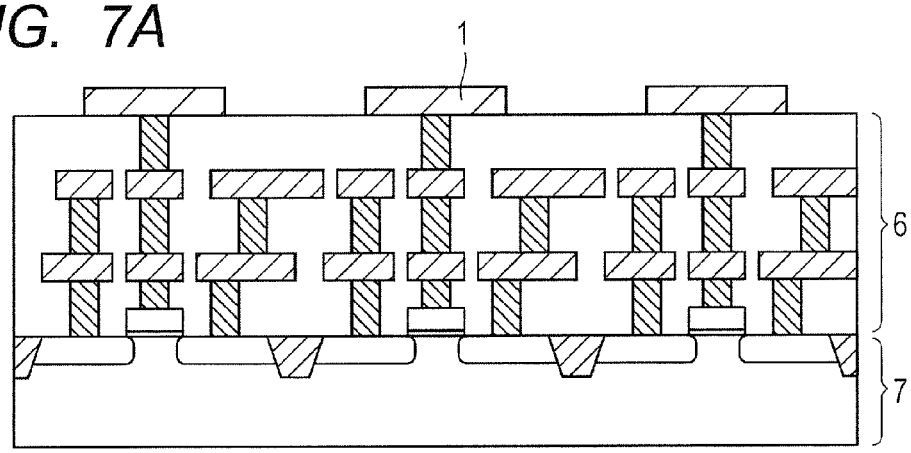
FIGS. 7A, 7B and 7C are schematic sectional views illustrating the process of manufacturing the stacked type solid state imaging apparatus according to the second embodiment in a step order.

Firstly, as is illustrated in FIG. 7A, similarly to the first embodiment, the semiconductor layer 7 and the wiring layer 6 are formed on the semiconductor substrate 10, and the pixel electrode 1 is formed on the wiring layer 6.

Figure 7B:
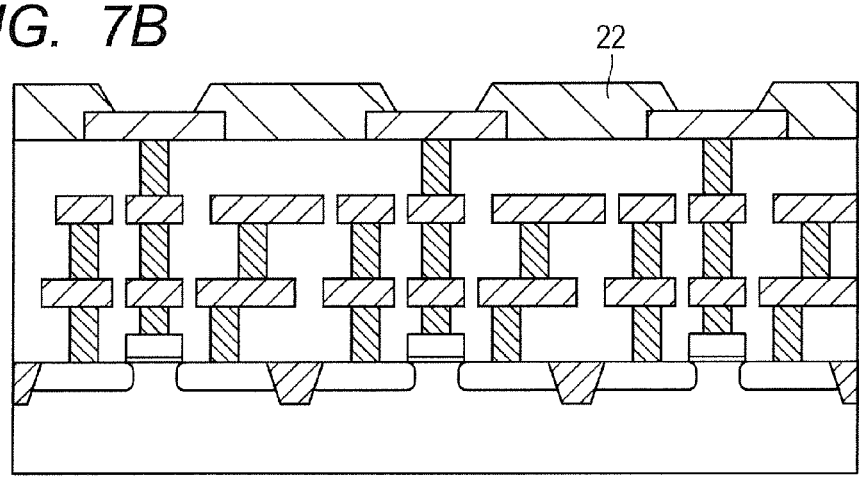

Subsequently, the pixel isolating film 22 is formed as is illustrated in FIG. 7B.

Specifically, an inorganic material such as $SiO_2$, SiN and SiC or an organic material such as acrylic and polyimide is formed on the whole surface on the wiring layer 6, and the surface thereof is planarized. After that, a resist mask is formed by lithography, and the material is etched until a part of the upper surface of the pixel electrode 1 is exposed, while using this resist mask. Thereby, the pixel isolating film 22 is formed.

When the inorganic material is used, the pixel isolating film 22 is desirably formed so as to have a thickness of approximately 200 nm to approximately 500 nm, and when the organic material is used, the pixel isolating film 22 is desirably formed so as to have the thickness of approximately 1 μm to approximately 2 μm. When the pixel isolating film 22 is formed appropriately thick, the leakage of the electric charge can be reduced, which occurs at the end of the pixel electrode 1. In addition, it can be more appropriate to form the pixel isolating film 22 thicker than the total film thickness of the pixel electrode 1 and the insulating film 21, in the point of reducing the crosstalk among the pixels.

As for a method of planarizing the upper surface of the pixel isolating film 22, when the inorganic material has been used, the pixel isolating film 22 is formed thicker than predetermined thickness, and then the film is subjected to a planarizing process of CMP. When the organic material has been used, such a material is used as to show an adequate planarization performance when the organic material has been applied. When the upper surface of the pixel isolating film 22 is flat, the thickness of the pixel isolating film 22 on the pixel electrode 1 becomes a value obtained by subtracting the thickness of the pixel electrode 1 from the thickness of the pixel isolating film 22 in the region between the adjacent pixel electrodes 1.

Incidentally, in the present embodiment as well, similarly to the pixel isolating film 5 in FIG. 5 in the first embodiment, the upper surface of the pixel isolating film 22 may not be planarized.

Figure 7C:
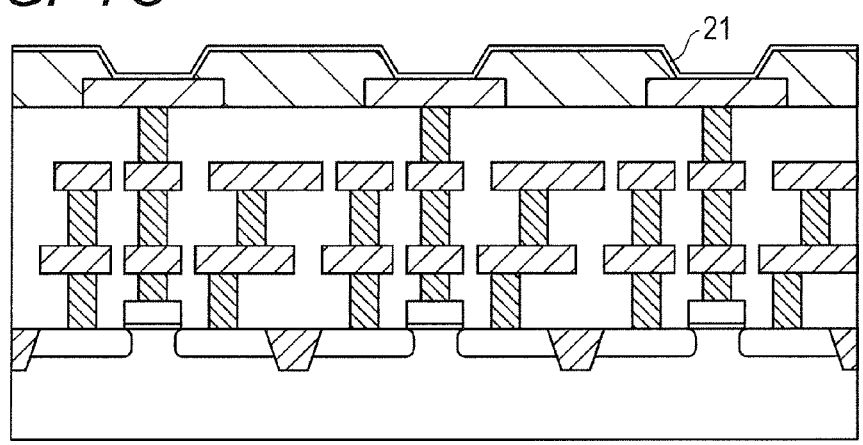

Subsequently, as is illustrated in FIG. 7C, the thin insulating film 21 is formed.

Specifically, a material of $SiO_2$, SiN, SiC or the like is deposited so as to have a thickness of approximately 10 nm to approximately 100 nm, with a CVD method, for instance. The $SiO_2$ has a small interface state density and accordingly is suitable for the material of the insulating film 21. By the above steps, the thin insulating film 21 is formed so as to cover the upper surface of the pixel electrode 1 and the pixel isolating film 22. When the insulating film 21 is formed thin, the voltage to be applied to the photoelectric conversion film 3 which will be formed in a subsequent step can be lowered, and the power consumption can be reduced. However, the insulating film 21 can be formed so that the thickness of the extent can be ensured in which electrons or holes cannot pass through the insulating film 21 in spite of the tunnel effect, and so that the thickness becomes larger than a step formed by concave and convex on the surface of the pixel electrode 1, in order to avoid a defect of the formed film.

In the present embodiment, the insulating film 21 is formed after the pixel isolating film 22 has been formed. Accordingly, when the pixel isolating film 22 is etched, the insulating film 21 does not exist on the pixel electrode 1, and it is not necessary to use different materials from each other for the insulating film 21 and the pixel isolating film 22. Because of this, the insulating film 21 and the pixel isolating film 22 can be formed from the same material, and a manufacturing process can be simplified.

Figure 8A:
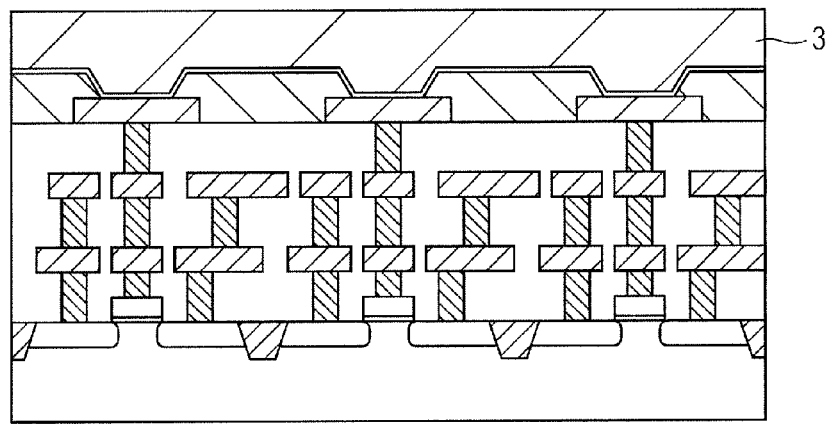
FIGS. 8A, 8B and 8C are schematic sectional views subsequent to FIGS. 7A, 7B and 7C, which illustrate the process of manufacturing a layer type solid imaging apparatus according to the second embodiment in the step order.

Subsequently, as is illustrated in FIG. 8A, the photoelectric conversion film 3 is formed similarly to the first embodiment.

Figure 8B:
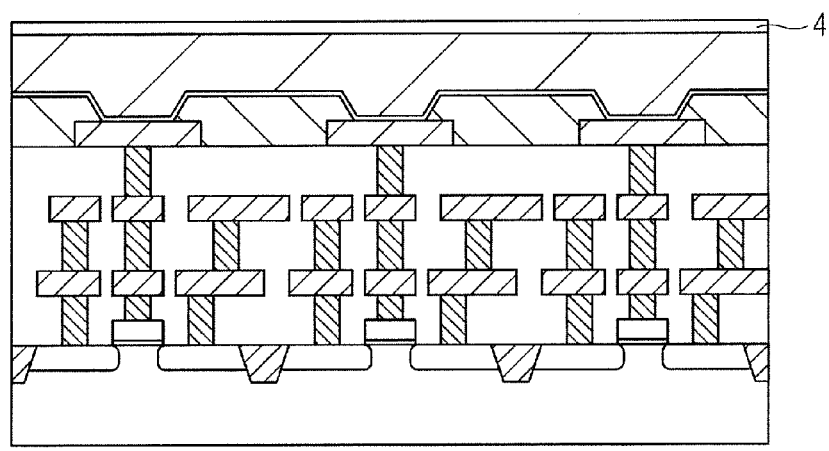
Figure 8C:
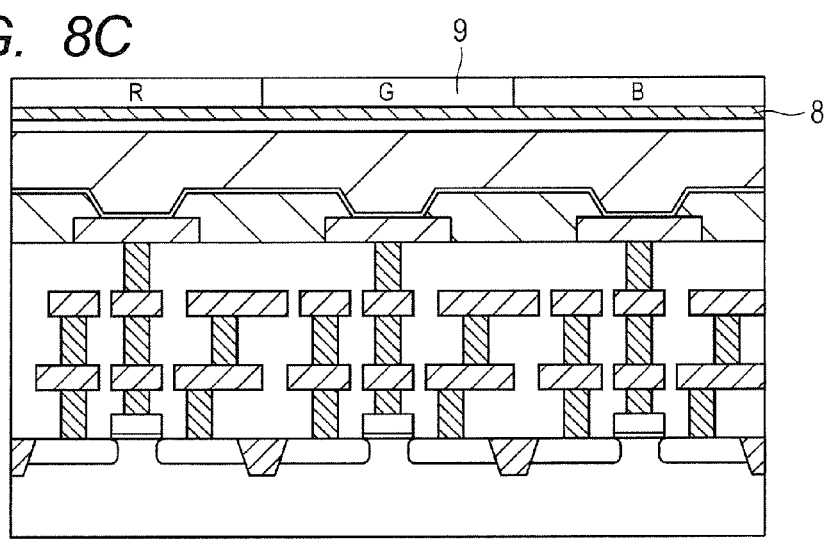

Subsequently, as is illustrated in FIG. 8B, the transparent electrode 4 is formed similarly to the first embodiment. After the above step, as is illustrated in FIG. 8C, the sealing layer 8 and the color filter layer 9 are sequentially formed similarly to the first embodiment.

In the above way, the stacked type solid state imaging apparatus according to the present embodiment is formed.

According to the present embodiment, the leakage of the electric charge can be avoided, which occurs at the end of the pixel electrode 1, and the variation in the voltage to be applied to the photoelectric conversion film 3 can be reduced, which occurs at the end of the pixel electrode 1. Thereby, the stacked type solid state imaging apparatus is achieved which has reduced variations in stabilization of operation and in photoelectric conversion characteristics among pixels, and further has reduced crosstalk among the pixels.

In addition, in the present embodiment, the insulating film 21 is formed on the pixel electrode 1 after the pixel isolating film 22 has been formed, accordingly there are few restrictions in the selection for the material of the insulating film 21 and the material of the pixel isolating film 22, and the manufacturing process is simplified.

Third Embodiment

Next, a third embodiment will be described. In the present embodiment, a stacked type solid state imaging apparatus is disclosed similarly to the first embodiment, but is different from the first embodiment in a point that the structure in the vicinity of the pixel electrode is different.

(Structure of Stacked Type Solid State Imaging Apparatus)

Figure 9:
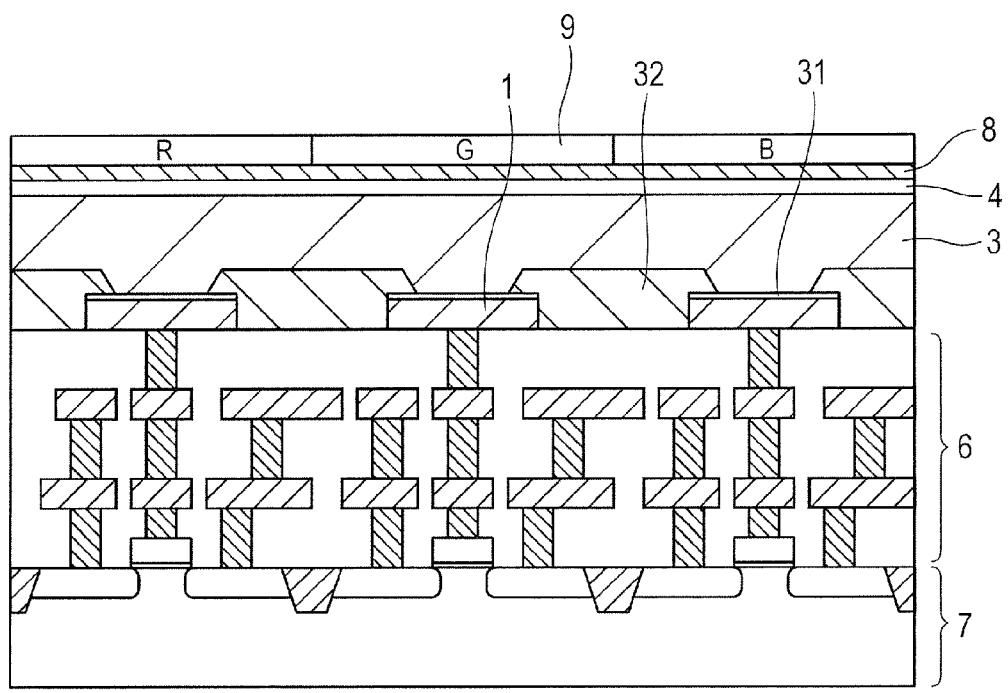
FIG. 9 is a schematic sectional view illustrating a structure of a pixel unit of a stacked type solid state imaging apparatus according to a third embodiment.

FIG. 9 is a schematic sectional view illustrating a structure of a pixel unit of the stacked type solid state imaging apparatus according to the third embodiment. The similar component members to those in the first embodiment are designated by the same reference numerals, and the detailed description will be omitted.

This solid imaging apparatus is provided with a plurality of pixel units. The pixel unit includes: a plurality of pixel electrodes 1 (three pixel electrodes in illustrated example); an insulating film 31 which is formed on the pixel electrode 1; the photoelectric conversion film 3 which is formed on the insulating film 31 and converts incident light into a signal charge; and the transparent electrode 4 which is formed on the photoelectric conversion film 3. The sealing layer 8 is formed on the transparent electrode 4, and the color filter layers 9 of R, G and B are arranged on the sealing layer 8. The pixel unit further has a pixel isolating film 32 of an insulating member provided between the adjacent pixel electrodes 1. In addition, the wiring layer 6 exists under the pixel electrode 1, and the semiconductor layer 7 which has the signal readout circuit formed thereon is provided under the wiring layer 6.

The insulating film 31 is a film for ensuring electric insulation between the pixel electrode 1 and the photoelectric conversion film 3, and is formed from an insulating material such as $SiO_2$, SiN and SiC to have a thickness of approximately 10 nm to approximately 100 nm. The insulating film 31 is arranged only on the upper surface of the pixel electrode 1.

The pixel isolating film 32 is arranged so that the end thereof contacts the end of the pixel electrode 1 (side surface of pixel electrode 1 in FIG. 9), or is arranged so that the end thereof contacts the end of the pixel electrode 1, and also on the upper surface of the pixel electrode 1 through the insulating film 31. Here, the pixel isolating film 32 is buried in the region between the adjacent pixel electrodes 1, and is formed so as to cover the surface from the side surface of the pixel electrode 1 up to a part of the upper surface thereof; and the upper surface thereof is planarized.

In the present embodiment, on the upper surface of the pixel electrode 1, the insulating film 31 is arranged, and in the vicinity of the end of the pixel electrode 1, the pixel isolating film 32 is arranged. The end of the pixel electrode 1 is covered with the thick pixel isolating film 32, the leakage of the electric charge from the photoelectric conversion film 3 is reduced, which occurs at the end, and the operation is stabilized. In addition, the end is covered with the pixel isolating film 32, and thereby a voltage to be applied to the photoelectric conversion film 3 is stabilized. The pixel isolating film 32 is formed so as to be buried in the region between the adjacent pixel electrodes 1, and thereby crosstalk between the pixels is reduced. The pixel isolating film 32 is formed thicker than the total film thickness of the pixel electrode 1 and the insulating film 31, and thereby the crosstalk is more surely reduced. The upper surface of the pixel isolating film 32 is planarized, and thereby the photoelectric conversion film 3 which is arranged on the pixel isolating film 32 can be flatly formed.

(Process of Manufacturing Stacked Type Solid State Imaging Apparatus)

A process of manufacturing the stacked type solid state imaging apparatus according to the present embodiment will be described below. FIGS. 10A to 11B are schematic sectional views illustrating the process of manufacturing the stacked type solid state imaging apparatus according to the third embodiment, in a step order. In FIGS. 10A to 11B, the same component members as those in FIG. 9 are designated by the same reference numerals.

Figure 10A:
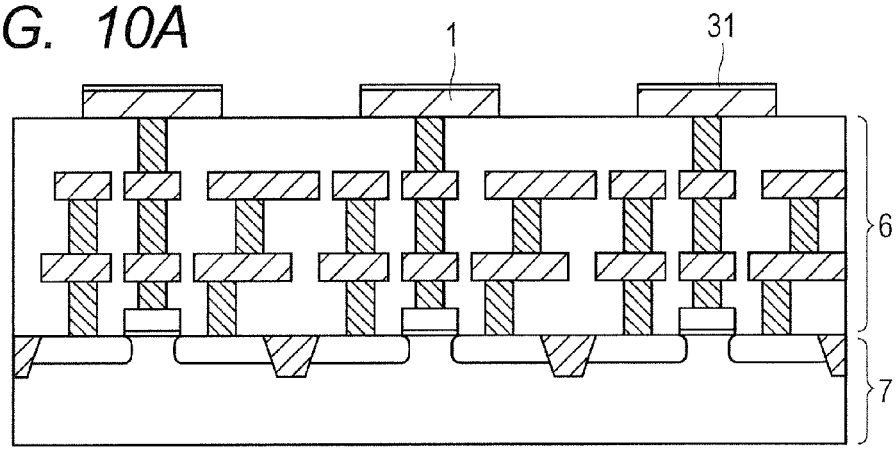
FIGS. 10A, 10B and 10C are schematic sectional views illustrating the process of manufacturing the stacked type solid state imaging apparatus according to the third embodiment in a step order.

In the present embodiment, as is illustrated in FIG. 10A, the pixel electrode 1 and the insulating film 31 thereon are collectively formed.

Specifically, firstly, similarly to the first embodiment, the semiconductor layer 7 and the wiring layer 6 are formed on the semiconductor substrate 10.

Next, the material of the pixel electrode 1 is film-formed on the whole surface of the wiring layer 6, and then the material of the insulating film 31 is film-formed thereon. The material of the pixel electrode 1 is selected from, for instance, Al, Cu, W, Ti, TiN and the like, and is formed so as to have the thickness of approximately 10 nm to approximately 500 nm. The material of the insulating film 31 is selected from, for instance, $SiO_2$, SiN, SiC and the like, and is formed so as to have the thickness of approximately 10 nm to approximately 100 nm.

Next, the film-formed material of the pixel electrode 1 and the film-formed material of the insulating film 31 are collectively patterned into electrode shapes. By the above steps, the pixel electrode 1 and the insulating film 31 thereon are formed on the wiring layer 6. Thus, the pixel electrode 1 and the insulating film 31 need not be formed in separate steps, and accordingly the manufacturing process is simplified.

When the insulating film 31 is formed thin, the voltage to be applied to the photoelectric conversion film 3 which will be formed in a post-step can be lowered, and the power consumption can be reduced. However, the insulating film 31 can be formed so that the thickness of the extent can be ensured in which electrons or holes cannot pass through the insulating film 31 in spite of the tunnel effect, and so that the thickness becomes larger than a step formed by concave and convex on the surface of the pixel electrode 1, in order to avoid a defect of the formed film.

Figure 10B:
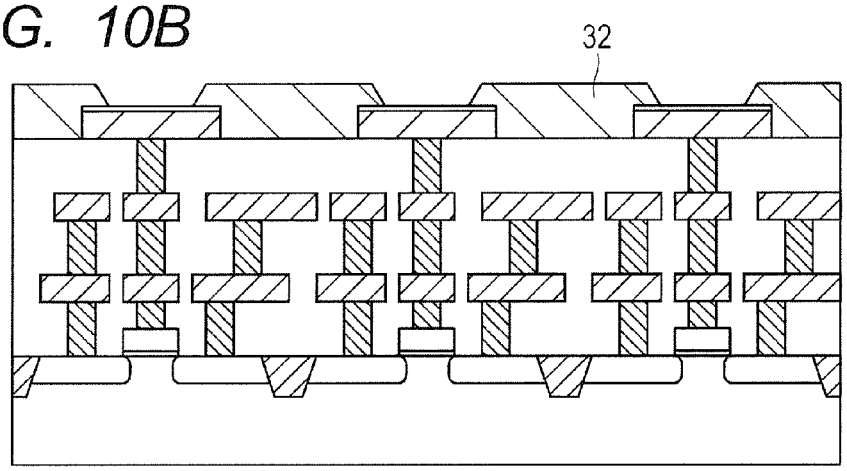

Subsequently, the pixel isolating film 32 is formed as is illustrated in FIG. 10B.

Specifically, an inorganic material such as $SiO_2$, SiN and SiC or an organic material such as acrylic and polyimide is formed on the whole surface so as to cover the pixel electrode 1 and the insulating film 31, and the surface thereof is planarized. After that, a resist mask is formed by lithography, and the material is etched until a part of the surface of the insulating film 31 is exposed, while using this resist mask. Thereby, the pixel isolating film 32 is formed. When the pixel isolating film on the pixel electrode 1 is removed, it is necessary to retain the insulating film 31 on the pixel electrode 1. Because of this, the material of the insulating film 31 and the material of the pixel isolating film 32 can be different from each other. For instance, it is considered to use SiN or SiC for the material of the insulating film 31, and use $SiO_2$, acrylic or polyimide for the material of the pixel isolating film 32.

When the inorganic material is used, the pixel isolating film 32 is desirably formed so as to have a thickness of approximately 200 nm to approximately 500 nm, and when the organic material is used, the pixel isolating film 32 is desirably formed so as to have the thickness of approximately 1 μm to approximately 2 μm. When the pixel isolating film 32 is formed appropriately thick, the leakage of the electric charge can be reduced, which occurs at the end of the pixel electrode 1. In addition, it can be more appropriate to form the pixel isolating film 32 thicker than the total film thickness of the pixel electrode 1 and the insulating film 31, in the point of reducing the crosstalk among the pixels.

As for a method of planarizing the upper surface of the pixel isolating film 32, when the inorganic material has been used, the pixel isolating film 32 is formed thicker than predetermined thickness, and then the film is subjected to a planarizing process of CMP. When the organic material has been used, such a material is used as to show an adequate planarization performance when the organic material has been applied. When the upper surface of the pixel isolating film 32 is flat, the thickness of the pixel isolating film 32 on the pixel electrode 1 becomes a value obtained by subtracting the thickness of the pixel electrode 1 from the thickness of the pixel isolating film 32 in the region between the adjacent pixel electrodes 1.

Incidentally, in the present embodiment as well, similarly to the pixel isolating film 5 in FIG. 5 in the first embodiment, the upper surface of the pixel isolating film 32 may not be planarized.

Figure 10C:
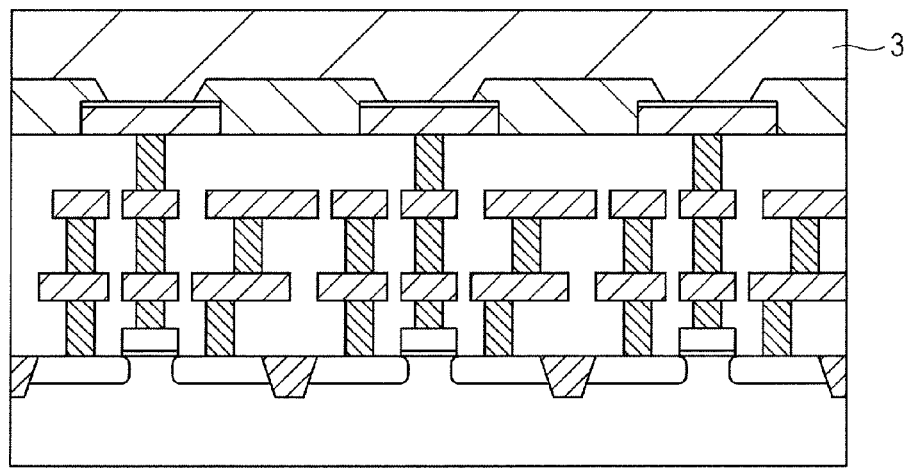

Subsequently, as is illustrated in FIG. 10C, the photoelectric conversion film 3 is formed similarly to the first embodiment.

Figure 11A:
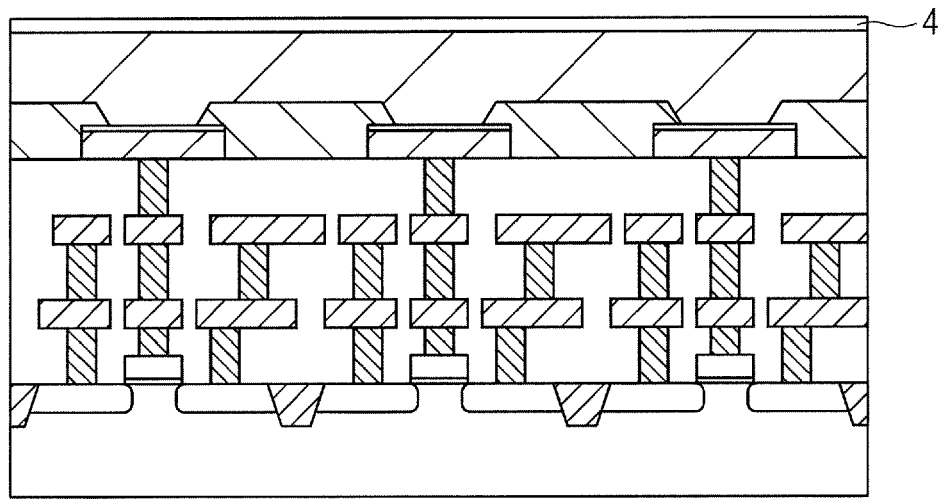
FIGS. 11A and 11B are schematic sectional views subsequent to FIGS. 10A, 10B and 10C, which illustrates the process of manufacturing a layer type solid imaging apparatus according to the third embodiment in the step order.

Subsequently, as is illustrated in FIG. 11A, the transparent electrode 4 is formed similarly to the first embodiment.

Figure 11B:
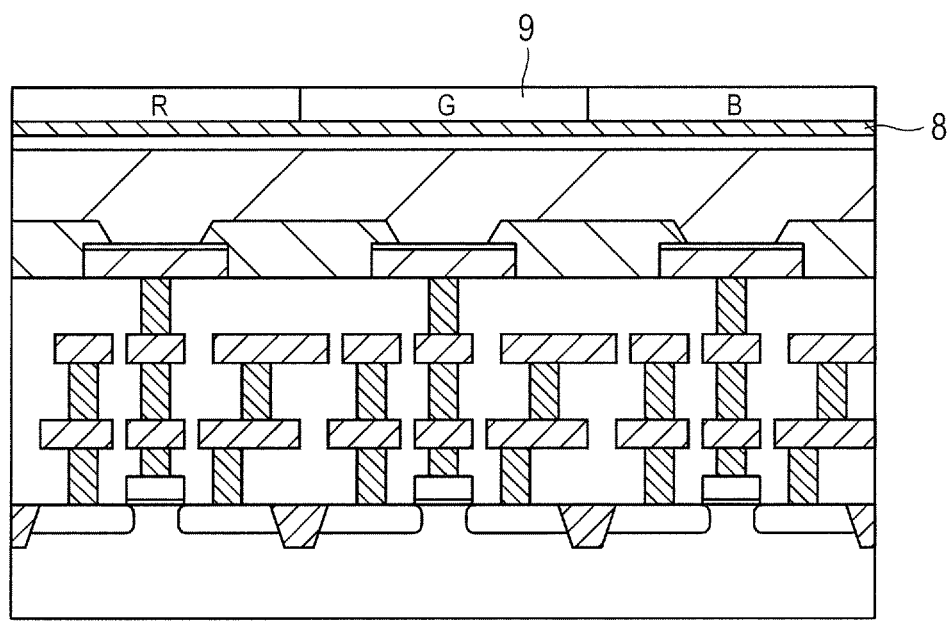

After the above step, as is illustrated in FIG. 11B, the sealing layer 8 and the color filter layer 9 are sequentially formed similarly to the first embodiment.

In the above way, the stacked type solid state imaging apparatus according to the present embodiment is formed.

According to the present embodiment, the leakage of the electric charge can be reduced, which occurs at the end of the pixel electrode 1. Thereby, the stacked type solid state imaging apparatus is achieved of which the operation is stabilized.

In addition, the variation in the voltage to be applied to the photoelectric conversion film 3 can be reduced, which occurs at the end of the pixel electrode 1. Thereby, the stacked type solid state imaging apparatus is achieved which has reduced variations in photoelectric conversion characteristics among pixels, and further has reduced crosstalk among the pixels.

In addition, in the present embodiment, the pixel electrode 1 and the insulating film 31 thereon are collectively formed, and accordingly the manufacturing process can be simplified.

The above described first to third embodiments can be appropriately changed and combined with the others. In addition, in the above described first to third embodiments, microlenses corresponding to the respective pixels can be formed on the respective color filters 9. When this microlens is formed, such an occurrence is reduced that oblique incidence light is incident on the adjacent pixel in the boundary of the side surface of the color filter 9, and causes crosstalk. In addition, the insulating film 2 may be positioned in any one of positions on and under the pixel isolating film 5, and the insulating film 2 may also be provided only on the upper surface of the pixel electrode 1. The phrase "only on the upper surface" means that when the pixel electrode 1 and the insulating film 2 are projectively viewed, the insulating film 2 is positioned within the outer edge of the pixel electrode 1. For instance, the insulating film 2 may be provided on the pixel isolating film 5 which is provided on the pixel electrode 1. Furthermore, in the above described first to third embodiments, the insulating film 2 and the pixel isolating film 5 can be formed of one layer of an insulating film. For instance, the insulating film 2 and the pixel isolating film 5 can be formed by an operation of removing a part of one layer of the insulating film. In this case, the insulating film 2 and the pixel isolating film 5 become an integrated structure.

Fourth Embodiment

Next, a fourth embodiment will be described. In the present embodiment, an imaging system (camera) is disclosed that is provided with one type of stacked type solid state imaging apparatus, which has been selected from the first to third embodiments.

Figure 12:
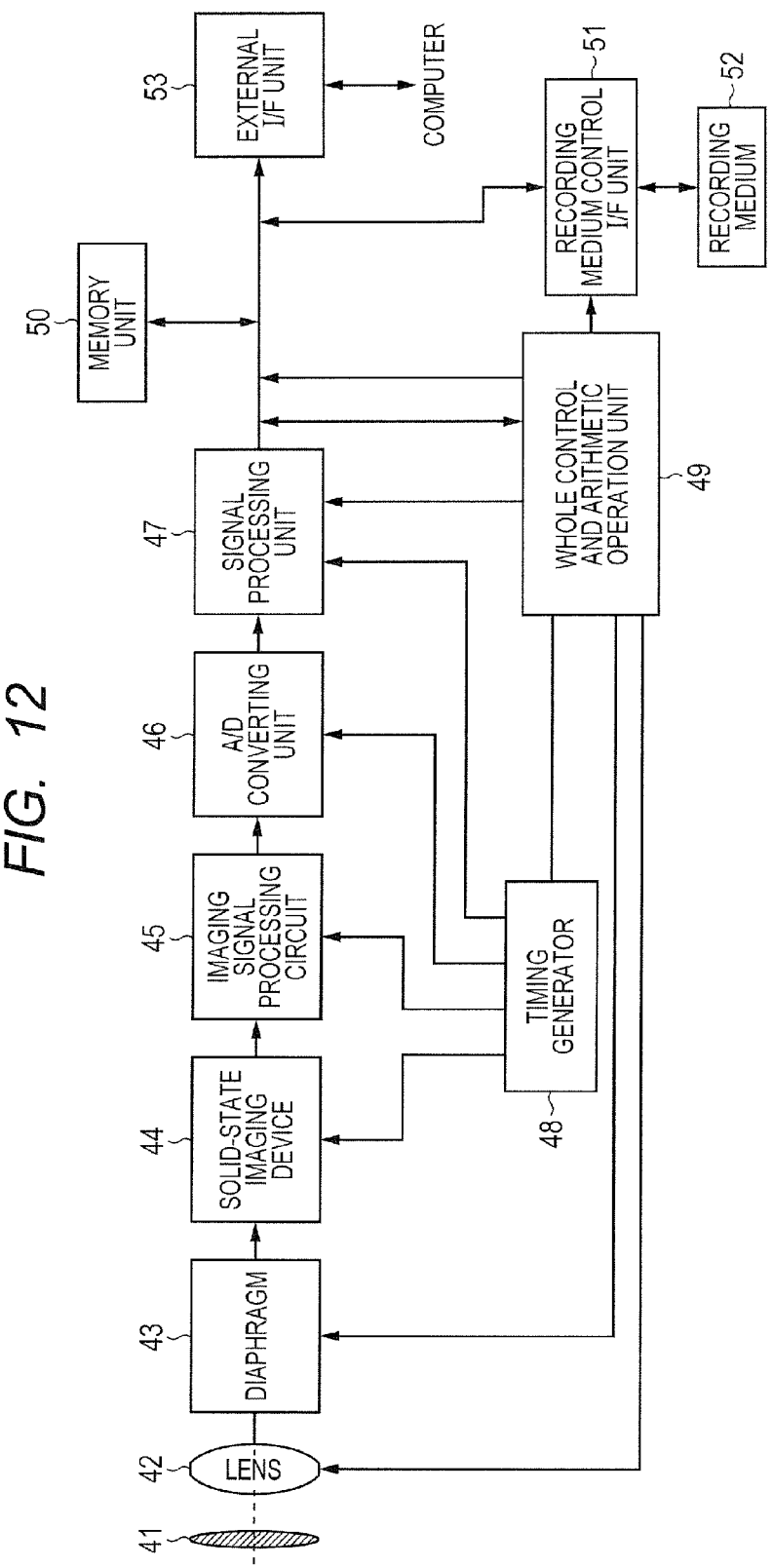
FIG. 12 is a block diagram illustrating a schematic structure of an imaging system according to a fourth embodiment.

FIG. 12 is a block diagram illustrating a schematic structure of the imaging system according to the fourth embodiment.

In this imaging system, a shutter 41 is arranged in front of an imaging lens (optical system) 42, and controls exposure. A diaphragm 43 controls a quantity of light, as needed, and the imaging lens 42 images light on a solid-state imaging device 44. The solid-state imaging device 44 corresponds to one type of stacked type solid state imaging apparatus, which has been selected from the first to third embodiments. An imaging signal which has been output from the solid-state imaging device 44 is processed by an imaging signal processing circuit 45, and the processed imaging signal is converted from an analog signal to a digital signal by an A/D converting unit 46. The output digital signal is further arithmetically processed by a signal processing unit 47. The processed digital signal is stored in a memory unit 50, or is transmitted to external equipment through an external I/F unit 53. The solid-state imaging device 44, the imaging signal processing circuit 45, the A/D converting unit 46 and the signal processing unit 47 are controlled by a timing generator 48, and besides, the whole imaging system is controlled by a whole control and arithmetic operation unit 49. In order to record the image, the whole control and arithmetic operation unit 49 records the output digital signal on a recording medium 52 through a recording medium control I/F unit 51 which is controlled by the whole control and arithmetic operation unit 49.

According to the present embodiment, in the imaging system, one type of stacked type solid state imaging apparatus, which has been selected from the first to third embodiments, is applied to the solid-state imaging device 44. Thereby, the leakage of the electric charge can be avoided, which occurs at the end of the pixel electrode, and the variation in the voltage to be applied to the photoelectric conversion film can be reduced, which occurs at the end of the pixel electrode. As a result, the imaging system is achieved which has reduced variations in stabilization of operation and in photoelectric conversion characteristics among pixels, further has reduced crosstalk among the pixels, and has high reliability.

Incidentally, note that each of the above embodiments is merely an example how the present invention can be practiced, and the technical scope of the present invention should not be restrictedly interpreted by the embodiments. In other words, the present invention can be practiced in various ways without departing from the technical concept or main features of the invention.

According to the present embodiment, the imaging apparatus and the imaging system are achieved that have the reduced leakage of the electric charge, which occurs at the end of the pixel electrode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-156766, filed Jul. 31, 2014, which is hereby incorporated by reference herein in its entirety.

What is claimed is:

1. An imaging apparatus comprising:
   electrodes arranged separately from each other, the electrodes including a pixel electrode;
   an insulating member arranged between the electrodes;
   a photoelectric conversion film arranged to cover the electrodes and the insulating member, the photoelectric conversion film being configured to convert an incident light to the photoelectric conversion film into a charge; and
   an insulating film arranged between an upper surface of the pixel electrode and the photoelectric conversion film so that the photoelectric conversion film does not contact the pixel electrode,
   wherein the insulating member has a side surface arranged on the upper surface of the pixel electrode, the side surface of the insulating member is inclined to the upper surface of the pixel electrode and is not perpendicular to the upper surface of the pixel electrode, the insulating member contacts the upper surface of the pixel electrode, and the insulating film extends between the side surface of the insulating member and the photoelectric conversion film, and both of the insulating member and the insulating film are continuously formed in a region between the electrodes.

2. The imaging apparatus according to claim 1, further comprising color filters arranged on the photoelectric conversion film, and a boundary of the color filters overlaps the insulating member.

3. The imaging apparatus according to claim 1, wherein the insulating film contacts the upper surface of the pixel electrode, and the insulating film contacts a side surface of the pixel electrode.

4. The imaging apparatus according to claim 3, wherein the insulating film contacts the photoelectric conversion film.

5. An imaging apparatus comprising:
electrodes arranged separately from each other, the electrodes including a pixel electrode;
an insulating member arranged between the electrodes;
a photoelectric conversion film arranged to cover the electrodes and the insulating member, the photoelectric conversion film being configured to convert an incident light to the photoelectric conversion film into a charge; and
color filters arranged on the photoelectric conversion film, wherein a boundary of the color filters overlaps the insulating member,
wherein the insulating member has a side surface which is arranged between the photoelectric conversion film and the upper surface of the pixel electrode, and the side surface of the insulating member is inclined to the upper surface of the pixel electrode and is not perpendicular to the upper surface of the pixel electrode.

6. The imaging apparatus according to claim 5, further comprising an insulating film arranged between an upper surface of the pixel electrode and the photoelectric conversion film so that the photoelectric conversion film does not contact the pixel electrode,
wherein the insulating film extends between the insulating member and upper surface of the pixel electrode in a direction perpendicular to the upper surface of the pixel electrode.

7. The imaging apparatus according to claim 5, further comprising an insulating film arranged between an upper surface of the pixel electrode and the photoelectric conversion film so that the photoelectric conversion film does not contact the pixel electrode,
wherein the insulating film extends between the side surface of the insulating member and the photoelectric conversion film.

8. The imaging apparatus according to claim 5, further comprising an insulating film arranged between an upper surface of the pixel electrode and the photoelectric conversion film so that the photoelectric conversion film does not contact the pixel electrode,
wherein the insulating film contacts an upper surface of the pixel electrode, and the insulating member contacts a side surface of the pixel electrode.

9. The imaging apparatus according to claim 5, further comprising an insulating film arranged between an upper surface of the pixel electrode and the photoelectric conversion film so that the photoelectric conversion film does not contact the pixel electrode,
wherein the insulating member has a thickness larger than at least one of a thickness of the pixel electrode and a thickness of the insulating film.

10. The imaging apparatus according to claim 9, wherein the insulating film is arranged between the pixel electrode and the insulating member so that the insulating member does not contact the pixel electrode.

11. The imaging apparatus according to claim 5, further comprising an insulating film arranged between an upper surface of the pixel electrode and the photoelectric conversion film so that the photoelectric conversion film does not contact the pixel electrode,
wherein the end of the insulating member contacts the insulating film and the photoelectric conversion film.

12. The imaging apparatus according to claim 5, further comprising an insulin film arranged between an upper surface of the pixel electrode and the photoelectric conversion film so that the photoelectric conversion film does not contact the pixel electrode,
wherein the insulating film and the insulating member are formed from the same material.

13. The imaging apparatus according to claim 5, further comprising an insulating film arranged between an upper surface of the pixel electrode and the photoelectric conversion film so that the photoelectric conversion film does not contact the pixel electrode,
wherein the insulating film and the insulating member are formed from mutually different materials.

14. The imaging apparatus according to claim 5, wherein the insulating member has a planar upper surface.

15. The imaging apparatus according to claim 5, wherein the insulating member has a concave upper surface.

16. The imaging apparatus according to claim 5, further comprising an insulating film arranged between an upper surface of the pixel electrode and the photoelectric conversion film so that the photoelectric conversion film does not contact the pixel electrode,
wherein the insulating film has a thickness larger than a thickness of the pixel electrode.

17. The imaging apparatus according to claim 4, wherein the insulating member contacts the photoelectric conversion film.

18. The imaging apparatus according to claim 4, further comprising:
a semiconductor substrate having a transistor; and
a wiring layer arranged between the semiconductor substrate and the electrodes,
wherein the wiring layer includes a wire connecting the pixel electrode to a gate electrode of the transistor.

19. The imaging apparatus according to claim 4, further comprising:
a semiconductor substrate having a transistor; and
a wiring layer arranged between the semiconductor substrate and the electrode,
wherein the wiring layer includes a wire connecting the pixel electrode to the transistor and includes an insulating layer arranged between the wire and the electrodes, and the insulating member is disposed on the insulating layer.

20. An imaging system comprising:
electrodes arranged separately from each other, the electrodes including a pixel electrode;
an insulating member arranged between the electrodes;
a photoelectric conversion film arranged to cover the electrodes and the insulating member;
an insulating film arranged between an upper surface of the pixel electrode and the photoelectric conversion film;
a signal readout circuit connected to the pixel electrodes; and
an insulating lens which images light on a device, the device including the photoelectric conversion film and the electrodes.
wherein the insulating member has a side surface which is arranged between the photoelectric conversion film and the upper surface of the pixel electrode, the side surface of the insulating member is inclined to the upper surface of the pixel electrode and is not perpendicular to the upper surface of the pixel electrode, and the insulating film extends between the side surface of the insulating member and the photoelectric conversion film.

* * * * *